United States Patent
McGivney et al.

(10) Patent No.: US 10,908,247 B2
(45) Date of Patent: Feb. 2, 2021

(54) SYSTEM AND METHOD FOR TEXTURE ANALYSIS IN MAGNETIC RESONANCE FINGERPRINTING (MRF)

(71) Applicant: Case Western Reserve University, Cleveland, OH (US)

(72) Inventors: Debra McGivney, Bay Village, OH (US); Samuel Frankel, Cleveland Heights, OH (US); Ananya Panda, Cleveland, OH (US); Chaitra Badve, Beachwood, OH (US); Vikas Gulani, Shaker Heights, OH (US)

(73) Assignee: CASE WESTERN RESERVE UNIVERSITY, Cleveland, OH (US)

(*) Notice: Subject to any disclaimer, the term of this patent is extended or adjusted under 35 U.S.C. 154(b) by 94 days.

(21) Appl. No.: 16/418,909

(22) Filed: May 21, 2019

(65) Prior Publication Data

US 2019/0353738 A1 Nov. 21, 2019

Related U.S. Application Data

(60) Provisional application No. 62/674,548, filed on May 21, 2018.

(51) Int. Cl.
*G01R 33/56* (2006.01)
*G01R 33/50* (2006.01)
(Continued)

(52) U.S. Cl.
CPC ..... *G01R 33/5608* (2013.01); *G01R 33/4828* (2013.01); *G01R 33/50* (2013.01); *G01R 33/543* (2013.01)

(58) Field of Classification Search
CPC .. G01R 33/4828; G01R 33/50; G01R 33/543; G01R 33/5608; G01R 33/448
See application file for complete search history.

(56) References Cited

U.S. PATENT DOCUMENTS 8,723,518 B2    5/2014  Seiberlich
10,527,695 B2 *  1/2020  Cohen ................ G01R 33/4828
(Continued)

OTHER PUBLICATIONS

Bates, A. et al. Prostate-specific membrane antigen PET/MRI validation of MR textural analysis for detection of transition zone prostate cancer. European Radiology, 2017;Epub.
(Continued)

*Primary Examiner* — Jay Patidar
(74) *Attorney, Agent, or Firm* — Quarles & Brady LLP

(57) ABSTRACT

A method for characterizing a tissue in a subject using magnetic resonance fingerprinting (MRF) includes acquiring MRF data from a tissue in a subject using a magnetic resonance imaging (MRI) system, comparing the MRF data to a MRF dictionary to identify quantitative values of at least one tissue property for the MRF data, generating a quantitative map based on the quantitative values of the at least one tissue property, identifying at least one region of interest on the quantitative map, determining at least one texture feature of the at least one region of interest of the quantitative map, characterizing the tissue in the at least one region of interest based on the at least one texture feature and generating a report indicating the characterization of the tissue based in the at least one texture feature.

20 Claims, 7 Drawing Sheets

(51) Int. Cl.
*G01R 33/48* (2006.01)
*G01R 33/54* (2006.01)

(56) References Cited

U.S. PATENT DOCUMENTS

| | | | | |
|---|---|---|---|---|
| 2015/0301141 | A1* | 10/2015 | Griswold | G01R 33/5608 |
| | | | | 382/131 |
| 2016/0278661 | A1* | 9/2016 | Griswold | A61B 5/004 |
| 2017/0103525 | A1* | 4/2017 | Hu | G06T 7/11 |
| 2018/0292492 | A1* | 10/2018 | Griswold | G01R 33/34092 |

OTHER PUBLICATIONS

Haralick, R. Textural features for image classification. IEEE Transactions on Systems, Man and Cybernetics, 1973:6;610-621.

Khalvati, F. et al., Automated prostate cancer detection via comprehensive multi-parametric magnetic resonance Imaging texture feature models. BMC Medical Imaging 2015;15:27.

Ma, D., et al. Magnetic resonance fingerprinting. Nature, 2013;495(7440):187-192.

Nketiah, G., et al. T2-weighted MRI-derived textural features reflect prostate cancer aggressiveness: preliminary results. European Radiology, 2017;27(7):3050-3059.

Wibmer, A. et al., "Haralick texture analysis of prostate MRI: utility for differentiating non-cancerous prostate from prostate cancer and differentiating prostate cancers with different Gleason scores." European radiology 25.10 (2015): 2840-2850.

Yu, A. C., et al. Development of a combined MR fingerprinting and diffusion examination for prostate cancer. Radiology 2017;283(3):729-738.

\* cited by examiner

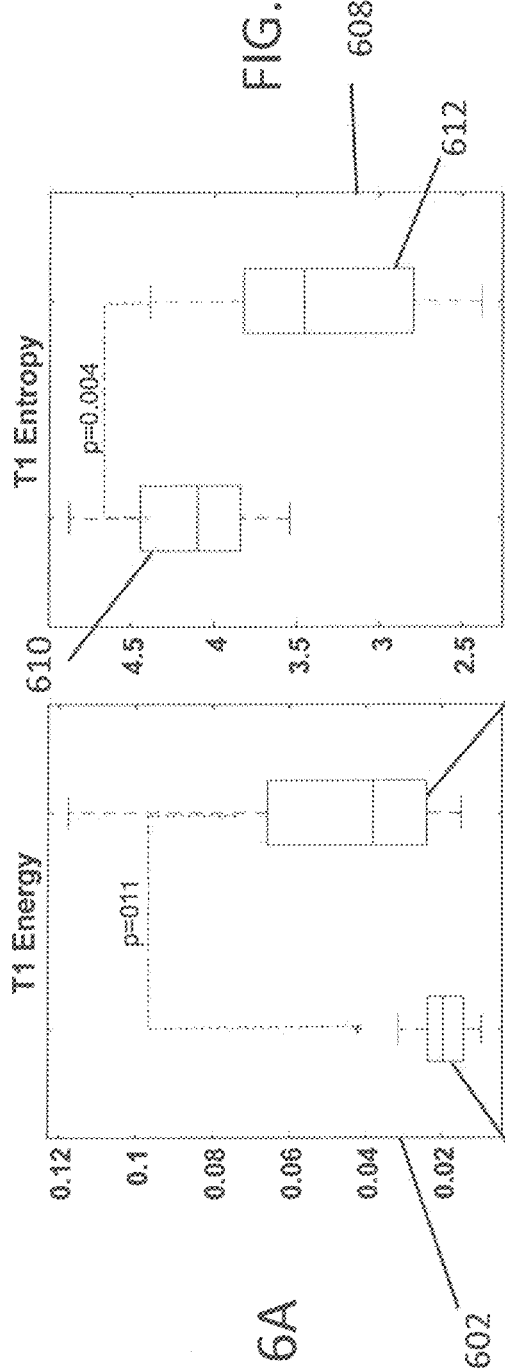
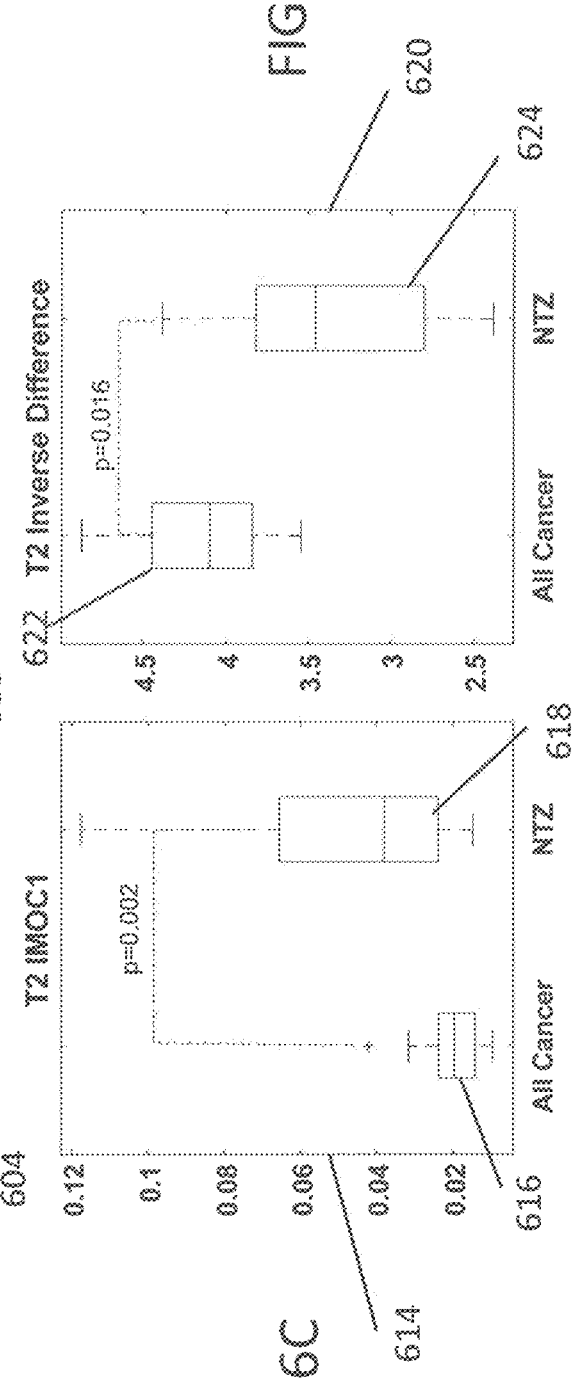

SYSTEM AND METHOD FOR TEXTURE ANALYSIS IN MAGNETIC RESONANCE FINGERPRINTING (MRF)

CROSS-REFERENCE TO RELATED APPLICATION

This application is based on, claims priority to, and incorporates herein by reference in its entirety U.S. Ser. No. 62/674,548 filed May 21, 2018, and entitled "System And Method For Texture Analysis In Magnetic Resonance Fingerprinting (MRF)."

STATEMENT REGARDING FEDERALLY SPONSORED RESEARCH

This invention was made with government support under EB016728 and CA208236 awarded by the National Institutes of Health. The government has certain rights in the invention.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," Nature, 2013; 495 (7440): 187-192.

Conventional magnetic resonance imaging ("MM") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a given echo time ("TE"), while a second pulse sequence may produce a T2-weighted signal at a different (or second) TE. These conventional pulse sequences typically provide qualitative results where data are acquired with various weighting or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2 weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MM, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known signal evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

Magnetic resonance imaging (MM) techniques and MRF techniques have been employed to attempt to differentiate normal tissue from prostate cancer. For example, MRI techniques such as conventional T2 weighted images, diffusion weighted images (DWI) with apparent diffusion coefficient (ADC) mapping, dynamic contrast-enhanced MRI (DCE-MRI), and MR spectroscopy (MRS) have been used for differentiating normal tissue form prostate cancer. Conventional MRI techniques, however, are limited by the qualitative nature of the images and the resulting subjective analysis of the images. For example, different reviewers (e.g., a radiologist or surgeon) of the images may arrive at different diagnoses when reading the same image. To improve analysis of qualitative MM images (e.g., T1-weighted and T2-weighted) and ADC maps used for differentiating normal tissue and prostate cancer, patterns of "pixel attributes", or texture analysis, may be used to identify prostate cancer. For example, second order statistical features, or "texture features" characterize pairs of pixels in an image, providing statistical information undetectable to the naked eye.

Previous MRF techniques have utilized a combination of MRF-based quantitative T1 and T2 values and MRI-based quantitative ADC values to differentiate between normal tissue and prostate cancer (e.g., between normal peripheral zone (PZ) tissue and PZ prostate cancer) and to differentiate between different Gleason scores or grades for prostate cancer. However, some residual overlap may be present in such analyses, for example, between prostatitis and prostate cancer. Prostatitis appears similar to prostate cancer in MRI and may lead to unnecessary biopsies of benign prostate. Texture analysis has not previously been applied to prostate tissue relaxometry maps.

SUMMARY OF THE DISCLOSURE

In accordance with an embodiment, a method for characterizing a tissue in a subject using magnetic resonance fingerprinting (MRF) includes acquiring MRF data from a tissue in a subject using a magnetic resonance imaging (MRI) system, comparing the MRF data to a MRF dictionary to identify quantitative values of at least one tissue property for the MRF data, generating a quantitative map based on the quantitative values of the at least one tissue property, identifying at least one region of interest on the quantitative map, determining at least one texture feature of the at least one region of interest of the quantitative map, characterizing the tissue in the at least one region of interest based on the at least one texture feature and generating a report indicating the characterization of the tissue based in the at least one texture feature.

In accordance with another embodiment, a magnetic resonance fingerprinting (MRF) system includes a magnet system configured to generate a polarizing magnetic field about at least a portion of a subject, a magnetic gradient system including a plurality of magnetic gradient coils configured to apply at least one magnetic gradient field to the polarizing magnetic field and a radio frequency (RF) system configured to apply an RF field to the subject and to receive magnetic resonance signals from the subject using a coil array. The system further includes a computer system programmed to acquire MRF data from a tissue in a subject, compare the MRF data to a MRF dictionary to identify quantitative values of at least one tissue property for the MRF data, generate a quantitative map based on the quantitative values of the at least one tissue property, identify at least one region of interest on the quantitative map, determine at least one texture feature of the at least one region of interest of the quantitative map, characterize the tissue in the at least one region of interest based on the at least one texture feature and generate a report indicating the characterization of the tissue based in the at least one texture feature.

BRIEF DESCRIPTION OF THE DRAWINGS

The present invention will hereafter be described with reference to the accompanying drawings, wherein like reference numerals denote like elements.

FIGS. 6A-6D illustrate example boxplots of texture features for comparison of significant texture features between cancer and non-cancer transition zone (TZ) regions of interest;

DETAILED DESCRIPTION

Figure 1:
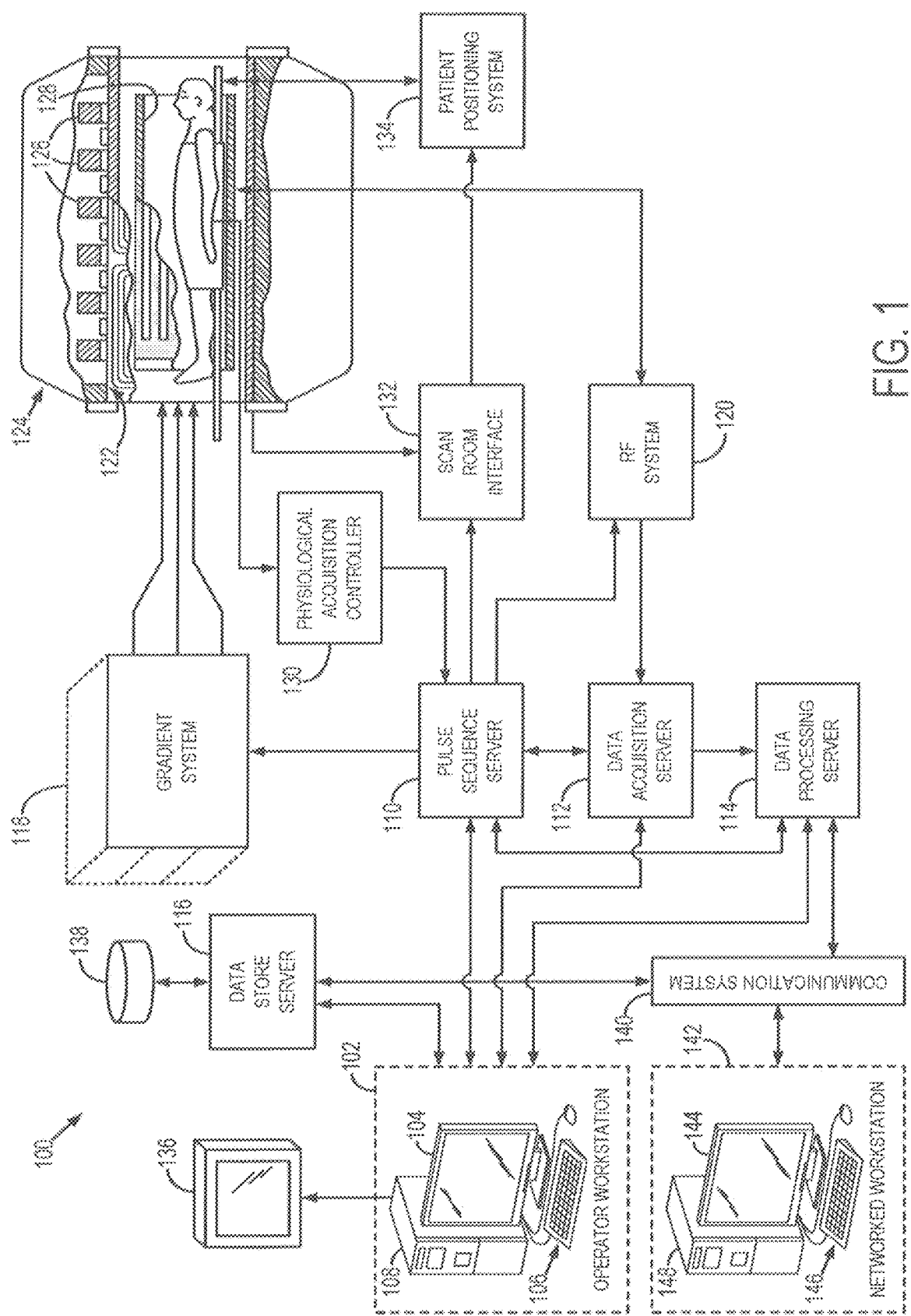
FIG. 1 is a schematic diagram of an example MM system in accordance with an embodiment.

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1, T_2, D)$ is a signal decay due to relaxation differences; and $M_0$ is the magnetization in the default or natural alignment to which spins align when placed in the main magnetic field.

While $E_i(T_1, T_2, D)$ is provided as an example, in different situations, the decay term, $E_i(T_1, T_2, D)$, may also include additional terms, $E_i(T_1, T_2, D, \ldots )$ or may include fewer terms, such as by not including the diffusion relaxation, as $E_i(T_1, T_2)$ or $E_i(T_1, T_2, \ldots)$). Also, the summation on "j" could be replace by a product on "j". The dictionary may store signals described by, $$S_i = R_i E_i (S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as T1 or T2 as well as acquisition parameters like flip angle (FA) and repetition time (TR). This signal timecourse can, thus, be referred to as a signal evolution and each pixel can be matched to an entry in the dictionary, which is a collection of possible signal evolutions or timecourses calculated using a range of possible tissue property values and knowledge of the quantum physics that govern the signal evolution. Upon matching the measured signal evolution/timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

To achieve this process, a magnetic resonance imaging (MRI) system or nuclear magnetic resonance (NMR) system may be utilized. FIG. 1 shows an example of an MRI system 100 in accordance with an embodiment. MRI system 100 may be used to implement the methods described herein. MRI system 100 includes an operator workstation 102, which may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MM system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MM pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2} \quad (3);$$

and the phase of the received magnetic resonance signal may also be determined according to the following relationship:

$$\varphi = \tan^{-1}\left(\frac{Q}{I}\right). \quad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

The present disclosure describes a system and method for applying texture analysis to MRF T1 and T2 maps to improve upon the quantitative MRF T1 and T2 data and to, for example, further characterize prostate pathologies. In an embodiment, MRF may be utilized with texture analysis to differentiate between prostate cancer, prostatitis, and normal prostate tissue in patients with suspected prostate cancer as well as to differentiate between different grades of prostate cancer. For example, texture analysis of prostate MRF T1 and T2 data allows quantitative differentiation between low grade cancer and immediate/high grade cancer in the peripheral zone. In another example, texture analysis of prostate MRF T1 and T2 data allows quantitative differentiation between low grade cancer and prostatitis in the transition zone, between intermediate grade cancer and prostatitis in the transition zone, between a combined set of all grades of cancer and prostatitis in the transition zone, and between a combined set of all grades of cancer and normal transition zone tissue. The robust nature of MRF allows texture analysis to be consistently compared between image series.

Figure 2:
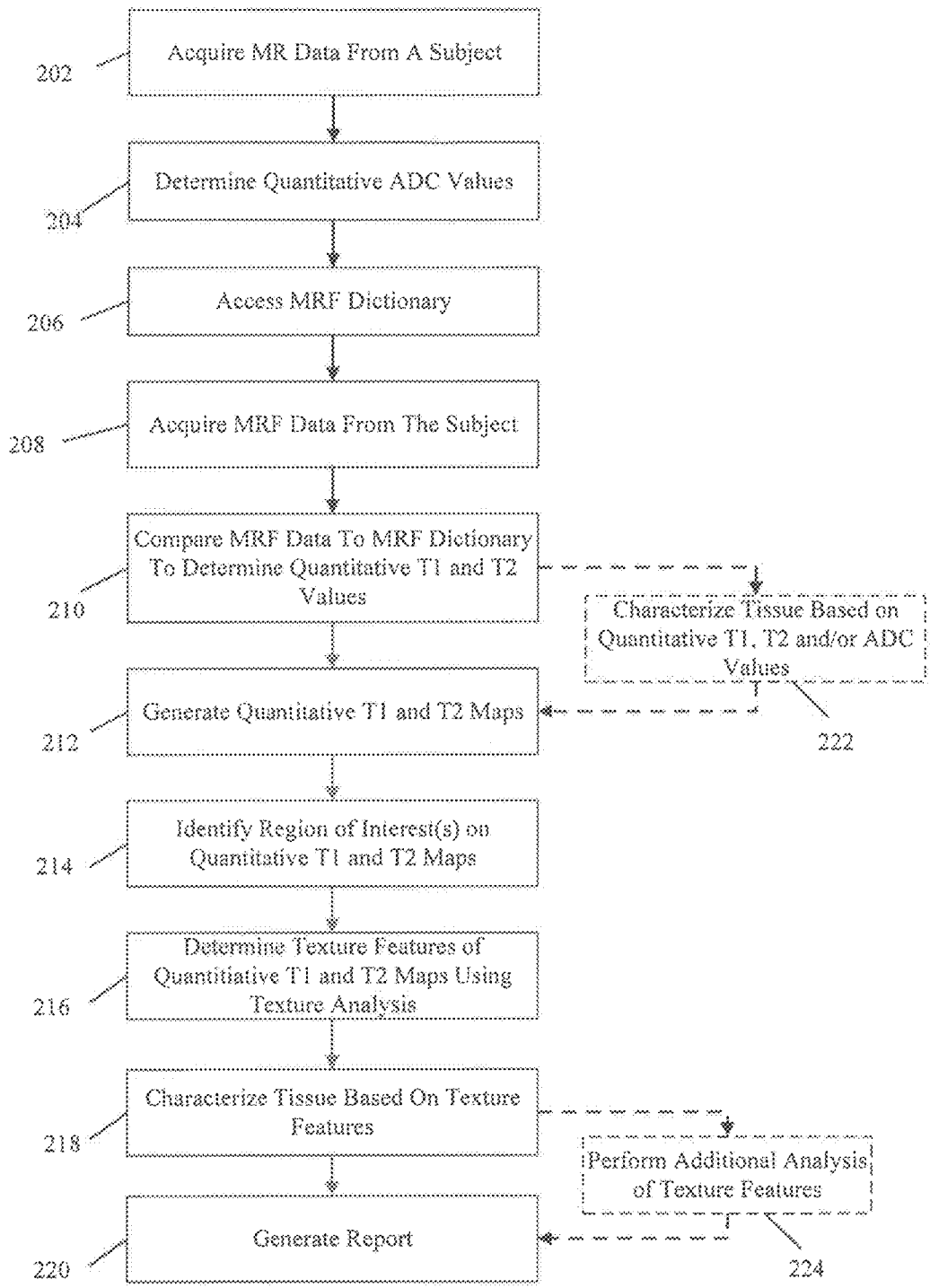
FIG. 2 illustrates a method for magnetic resonance fingerprinting with texture analysis in accordance with an embodiment.

FIG. 2 illustrates a method for magnetic resonance fingerprinting with texture analysis in accordance with an embodiment. While the embodiments and examples herein are discussed with regard to the prostate and prostate cancer, it should be understood that the system and method disclosed may also be used to characterize tissues of other anatomy and other types of disease. At block 202, MR data is acquired from a region of interest in a subject using, for example, an MRI system (e.g., MRI system 100 shown in FIG. 1). In an embodiment, the MR data is acquired using a diffusion weighted imaging (DWI) acquisition so the MR data may be used for quantitative apparent diffusion coefficient (ADC) mapping. For example, the MR data may be acquired using a high resolution T2 w, diffusion weighted imaging using echo planar imaging. At block 204, the MR data are used to determine quantitative ADC values. The ADC is the measure of the mobility of diffusion of water molecules in tissue. The MR data acquired with diffusion weighted imaging may be used to calculate the ADC. The ADC value may be assessed using, for example, different b values via changing gradient amplitudes. In one example, the acquisition (block 202) uses b values of 50-1400 s/mm$^2$. The ADC values determined at block 204 may be displayed as a parametric map that reflects the degree of diffusion of water molecules trough different tissues.

At block 206, a MRF dictionary is accessed. As used herein, the term "accessing" may refer to any number of activities related to generating, retrieving or processing the MRF dictionary using, for example, MRI system 100 (shown in FIG. 1), an external network, information repository, or combinations thereof. The MRF dictionary includes known signal evolutions (e.g., simulated signal evolutions). In an embodiment, the MRF dictionary may be generated using a Bloch simulation. The MRF dictionary may be stored in memory or data storage of, for example, an MRI system (e.g., the MRI system 100 of FIG. 1) or other computer system.

At block 208, MRF data is acquired from the region of interest in the subject using, for example, an MRI system (e.g., MRI system 100 shown in FIG. 1). The MRF data may be acquired using a pulse sequence such as, for example, a fast imaging with steady-state free precession (FISP)-MRF sequence. The MRF data acquired at block 208 is stored and compared to the MRF dictionary at block 210 to match the acquired signal evolutions with signal evolutions stored in the MRF dictionary. "Match" as used herein refers to the result of comparing signals. "Match" does not refer to an exact match, which may or may not be found. A match may be the signal evolution that most closely resembles another signal evolution. Comparing the MRF data to the MRF dictionary may be performed in a number of ways such as, for example, using a pattern matching, template matching or other matching algorithms. In one embodiment, the inner products between the normalized measured time course of each pixel and all entries of the normalized dictionary are calculated, and the dictionary entry corresponding to the maximum value of the inner product is taken to represent the closest signal evolution to the acquired signal evolution. In another embodiment, the matching may be performed using orthogonal matching pursuit (OMP). Quantitative values of at least one tissue property of the MRF data are determined based on the matching dictionary entry or entries identified by the comparison at block 210. In an embodiment, quantitative T1 and T2 values are determined based on the comparison at block 210. At block 212, quantitative maps of the at least one tissue property are generated from the quantitative values determined at block 212. In an embodiment, quantitative T1 and T2 maps are generated from the quantitative T1 and T2 values determined at block 212.

At block 214, at least one region of interest (ROI) is identified on the quantitative maps generated at block 212, for example, quantitative T1 and T2 maps. In an embodiment, regions of interest may be drawn on the MRF T1 and T2 maps in both cancer suspicious regions and normal tissue. Regions of interest may be drawn around, for example, lesions in the transition zone (TZ) or peripheral zone (PZ) as well as a healthy area of tissue for comparison. In one example, a radiologist may draw regions of interest on the T1 and T2 maps based on clinical MRI reads by another radiologist. The mean ROI size may be, for example, 66.3 mm$^2$. At block 216, texture features are determined for each ROI of the quantitative maps (e.g., quantitative T1 and T2 maps) using texture analysis. In an embodiment, second order texture features may be calculated for each ROI using Haralick texture features. In an embodiment, twenty-six texture features were calculated. The Haralick texture features may be calculated or derived using either Gray Level Co-occurrence Matrices (GLCM) or Gray Level Run Length Matrices (GLRLM).

Figure 3:
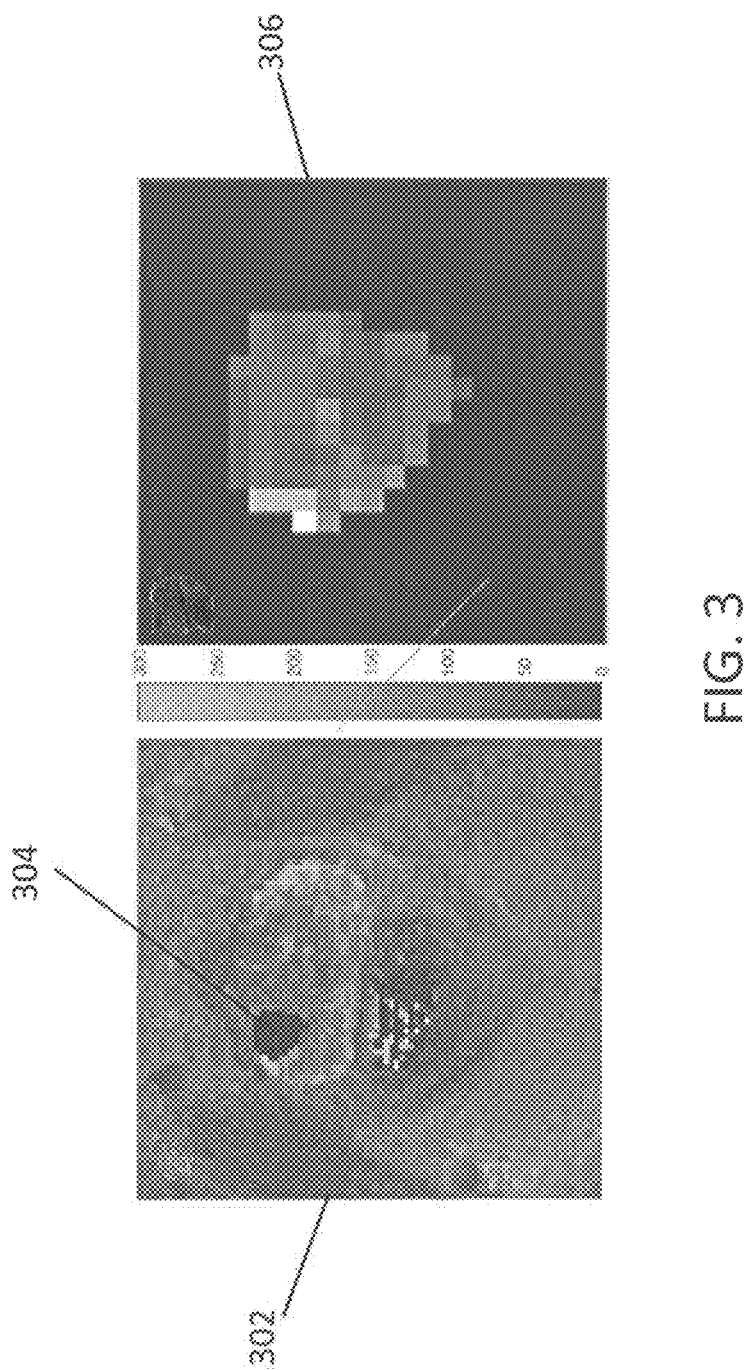
FIG. 3 shows an example MRF-based T2 map of with a region of interest (ROI) drawn on a transition zone lesion and the ROI of the lesion after conversion to 4-bit gray level image in accordance with an embodiment.
Figure 4:
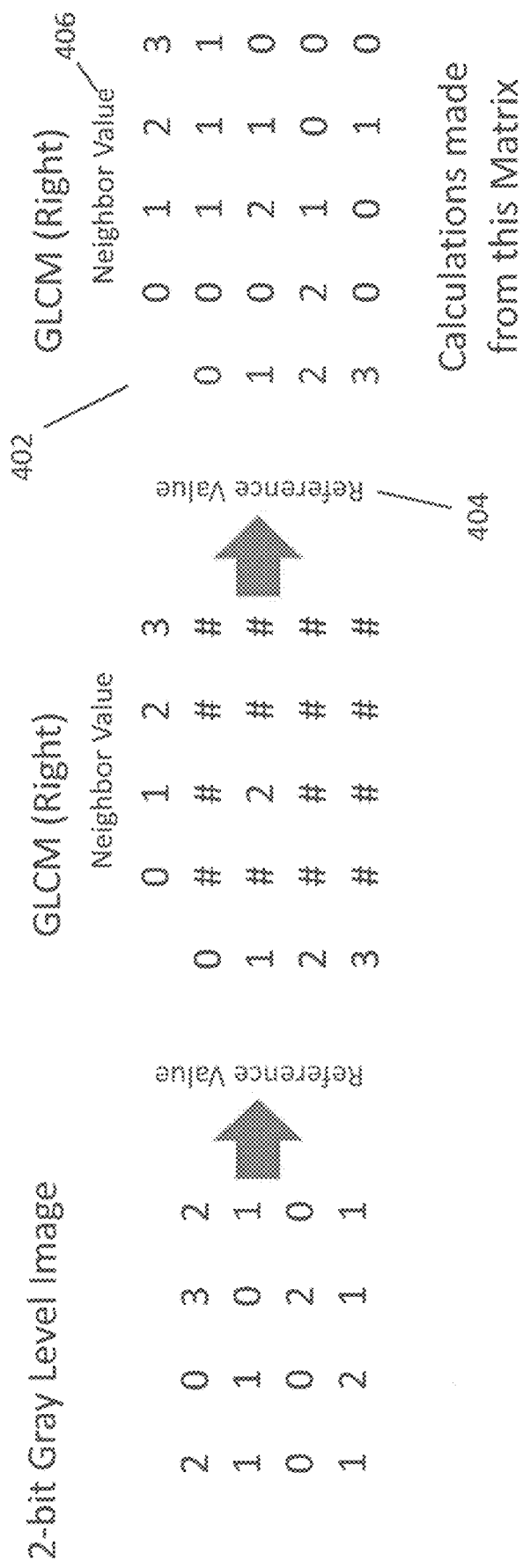
FIG. 4 illustrates an example Gray Level Co-occurrence Matrix (GLGM) in accordance with an embodiment.

A GLGM measures the spatial relationship between grayscale images. The following description will refer to 4-bit grayscale images. To create a GLGM, the original image is converted into a grayscale image with quantized gray levels. FIG. 3 shows an example MRF-based T2 map of with a region of interest (ROI) drawn on a transition zone lesion and the ROI of the lesion after conversion to 4-bit gray level image in accordance with an embodiment. In the example of FIG. 3, a MRF-based T2 map 302 of a prostate with a ROI 304 drawn on a transition zone (TZ) prostate cancer lesion. The ROI 304 of the prostate cancer lesion is converted to a 4-bit gray level image 306. Each pixel is measured, as is a "neighbor" pixel with a specific spatial relationship to the first pixel. FIG. 4 illustrates an example GLGM in accordance with an embodiment. The GLCM 402 is a two-dimensional matrix with the first dimension representing the gray level value of the measured pixels 404, and the second dimension representing the gray level value of the neighbor pixel 406. The GLCM is populated with counts of pixel-neighbor values. From the GLCM, texture features are calculated. In an embodiment, nineteen texture features are calculated including autocorrelation, cluster prominence, cluster shade, contrast, correlation, difference entropy, difference variance, dissimilarity, energy, entropy, homogeneity, information measure of correlation 1, information measure of correlation 2, inverse difference, maximum probability, sum average, sum entropy, sum of squares: variance, and sum variance.

Figure 5:
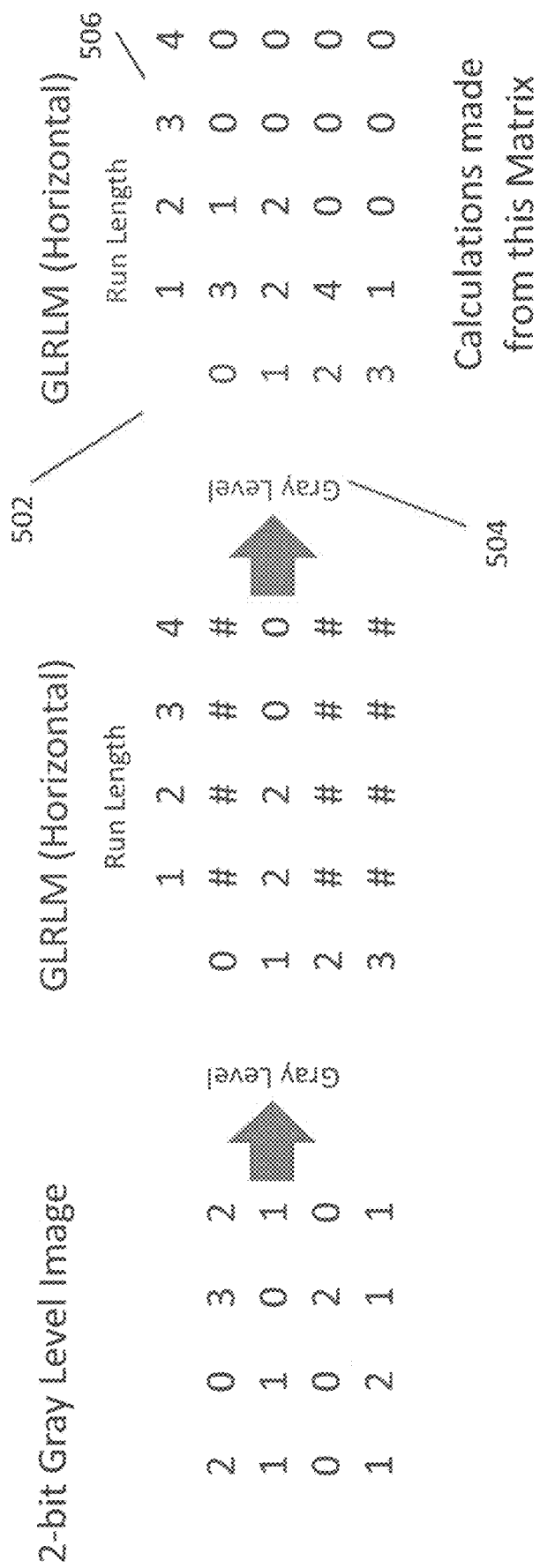
FIG. 5 illustrates an example Gray Level Run Length Matrix (GLRLM) in accordance with an embodiment.

A GLRLM is also a matrix which represents spatial relationships in a grayscale image with quantized gray levels. A GLRLM measures the number of occurrences of consecutive pixels of the same value in a single direction known as a "run". FIG. 5 illustrates an example of a GLRLM in accordance with an embodiment. The GLRLM 502 is a two-dimensional matrix, in which the first dimension represents the possible gray level values 504. The second dimension represents the length 506 of any given run. The GLRLM is then populated with the counts of run numbers of a given length with a given gray level. From the GLRLM, texture features are calculated. In an embodiment, seven texture features are calculated including short run emphasis, long run emphasis, gray level non-uniformity, run percentage, run length non-uniformity, low gray level run emphasis, and high gray level run emphasis.

Returning to FIG. 2, in an embodiment Spearman rank correlation coefficients may be calculated and used to remove redundant texture features from the texture features determined at block 216. In one example described above with twenty-six calculated texture features, Spearman correlation coefficients were used to remove eight texture features. At block 218, the determined texture features are used to characterize a tissue or tissues in the region(s) of interest. In an embodiment, the characterization identifies the presence of cancerous tissue in the region of interest. In another embodiment, the characterization identifies the grade of cancerous tissue (e.g. prostate cancer) in the region of interest. Differences between texture features in prostate cancer tissue and non-cancerous tissue (e.g., normal tissue or prostatitis) may be used to characterize tissue as, for example, prostate cancer, prostatitis, or normal prostate tissue (peripheral zone or transition zone). In addition, differences between texture features in grades of prostate cancer may be used to grade identified cancerous tissue. In an example, the values of one or more of the determined texture features may be used to differentiate between prostate cancer tissue and normal or non-cancerous prostate tissue to identify prostate tumors. The texture features may be correlated with the gold standard pathologic diagnosis. For example, the texture features may be correlated with low grade cancer (e.g., GS 6), intermediate grade cancer (e.g., GS 7), high grade cancer (e.g., GS>8) and prostatitis, as well as normal prostate tissue. Student's t-test may be used to differentiate between prostate cancer and normal tissue based on the values of one or more texture features of the region of interest. In an embodiment, Student's t-tests may be performed on texture features between different diagnoses (e.g., GS 6-9 cancer and prostatitis) to characterize lesions. Bonferroni correction may be applied to correct for multiple comparisons.

Figure 8:
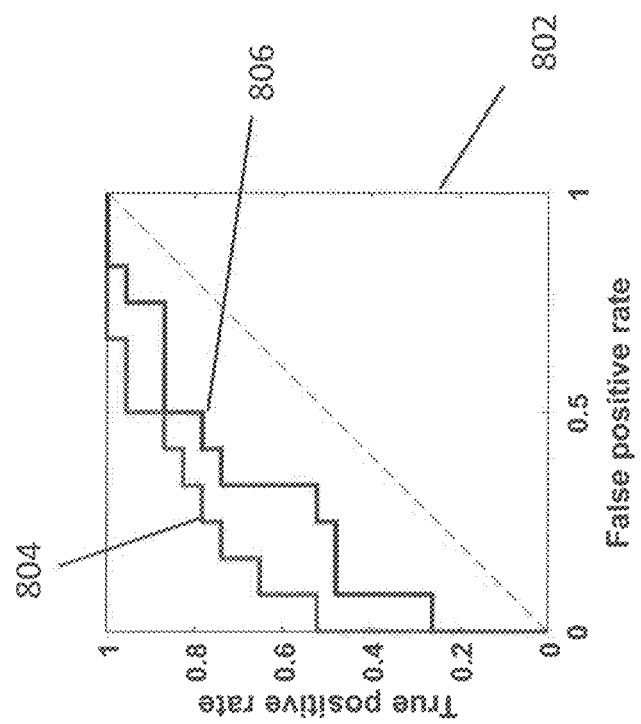
FIG. 8 illustrates an example ROC curve for two texture features.

The example results illustrated in FIGS. 6A-6D, 7 and 8 demonstrate that texture features of MRF derived relaxometry may be used to quantitatively differentiate cancer and non-cancerous tissue (e.g., prostate cancer, prostatitis, and normal prostate tissue). The results shown in FIGS. 6A-6D, 7 and 8 were obtained by applying the methods described herein to an example dataset. FIGS. 6A-6D illustrate example boxplots of texture features for comparison of significant texture features between cancer and non-cancer TZ ROIs. In FIG. 6A, the boxplot 602 shows example values of the texture feature T1 Energy for all cancer 604 compared to prostatitis 606 from analysis of the example dataset. In FIG. 6B, the boxplot 608 shows example values of the texture feature T1 Entropy for all cancer 610 compared to prostatitis 612 from analysis of the example dataset. In FIG. 6C, boxplot 614 shows example values for the texture feature T2 informational measure of correlation 1 (IMOC1) for all cancer 616 compared to normal TZ tissue 618 from analysis of the example dataset. In FIG. 6D, boxplot 620 shows example values for the texture feature T2 Inverse difference for all cancer 622 compared to normal TZ tissue 624 from analysis of the example dataset. In this example, after Bonferroni corrections the texture feature T2 cluster shade was significantly different between intermediate and high grade cancer for PZ lesions (p=0.01; AUC=0.67). For transition zone, the texture features $T_1$ energy and entropy were shown to be significantly different between cancer and prostatitis in the example analysis (p=0.011, p=0.004; AUC=0.80, AUC=0.81 respectively) as illustrated on FIGS. 6A and 6B and FIG. 7 (discussed below). The texture features T2 informational measure of correlation 1 (IMOC1) and inverse difference were shown to be significantly different between normal TZ and cancer in the example analysis (p=0.002, p=0.016; AUC=0.86, AUC=0.74 respectively) as illustrated in FIGS. 6C, 6D and FIG. 8 (discussed below). In addition, the texture features $T_1$ energy and entropy and T2 IMOC1 and inverse difference were shown to be significantly different between TZ cancer and non-cancer tissue (e.g., combined normal TZ tissue and prostatitis) in the example analysis (p=0.039, p=0.020, p=0.003, p=0.048; AUC=0.72, AUC=0.71, AUC=0.83, AUC=0.68 respectively).

Figure 7:
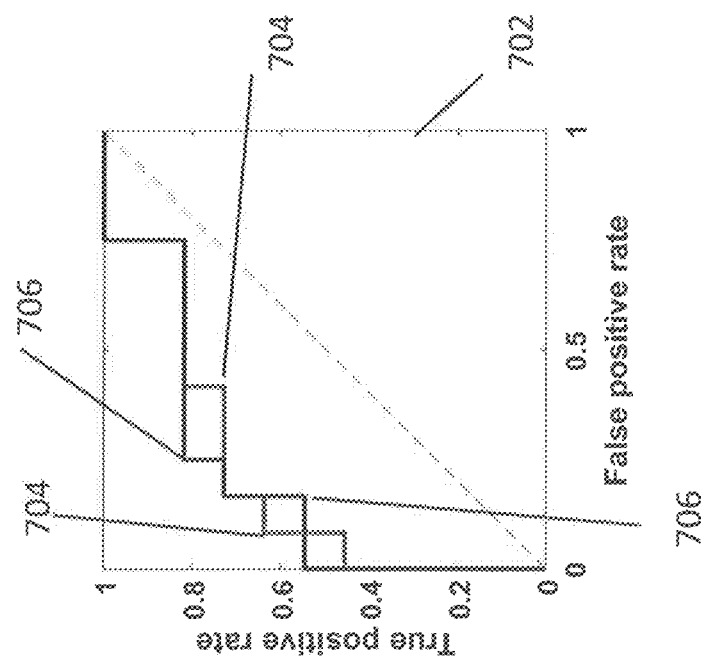
FIG. 7 illustrates an example Receiver Operating Characteristic (ROC) curve for two texture features.

At block 224, additional analyses may be performed on significant texture features. For example, logistic regression models may be created to calculate Receiver Operating Characteristic (ROC) curves. In another example, Area Under the Curve's (AUC) may be calculated. AUC values are calculated for a significant result for significant texture features. FIG. 7 illustrates an example Receiver Operating Characteristic (ROC) curve for two texture features. In FIG. 7, an example ROC curve 702 for the $T_1$ energy 704 and T1 entropy 706 texture features is shown for comparison between all cancer and prostatitis groups for the example dataset. In this example, AUCenergy=0.80 and AUCentropy=0.81. FIG. 8 illustrates an example ROC curve for two texture features in accordance with an embodiment. In FIG. 8, an example ROC curve 802 for T2 IMOC1 804 and T2 inverse difference 806 texture features is shown for comparison between all cancer and non-cancerous prostate groups for the example dataset. In this example, AUCIMOC=0.86 and AUCinvdiff=0.74.

At block 220, a report may be generated indicating an output that separates prostate cancer tissue from non-cancerous tissue in a region of interest based on the values of the determined texture features of the regions of interest in the quantitative T1 and T2 maps. In addition, the report may indicate an output that separates low, intermediate and high grade cancers for identified cancer tissue based on the values of the determined texture features in the quantitative T1 and T2 maps. The report may include, for example, images or maps, text or metric based reports, audio reports and the like. For example, the report may include an image that illustrates regions having prostate cancer tissue and regions not having prostate cancer tissue. In another embodiment, at block 222 the quantitative ADC values (block 204) and quantitative T1 and T2 values (block 210) may be used to generate a multi-parametric map that may be included in the report. The multi-parametric map is based on a combination of the quantitative ADC, T1 and T2 values. The multi-parametric map may also be used to differentiate between cancer and non-cancerous tissue. In another embodiment, the texture analysis (blocks 214, 216 and 218 of FIG. 2) may be applied to the multi-parametric map. The report may be provided to a display (e.g., display 104, 136 or 144 shown in FIG. 1). While FIG. 2 illustrates various actions occurring in serial, it is to be appreciated that various actions illustrates in FIG. 2 could occur substantially in parallel.

Computer-executable instructions for characterizing a tissue in a subject using magnetic resonance fingerprinting and texture analysis according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly states, are possible and within the scope of the invention. The order and sequence of any process or method steps may be varied or re-sequenced according to alternative embodiments.

The invention claimed is:

1. A method for characterizing a tissue in a subject using magnetic resonance fingerprinting (MRF), the method comprising:
   acquiring MRF data from the tissue in the subject using a magnetic resonance imaging (MRI) system;
   comparing the MRF data to a MRF dictionary to identify quantitative values of at least one tissue property for the MRF data;
   generating a quantitative map based on the quantitative values of the at least one tissue property;
   identifying at least one region of interest on the quantitative map;
   determining at least one texture feature of the at least one region of interest of the quantitative map;
   characterizing the tissue in the at least one region of interest based on the at least one texture feature; and
   generating a report indicating the characterization of the tissue based in the at least one texture feature.

2. The method according to claim 1, wherein the at least one tissue property is T1.

3. The method according to claim 1, wherein the at least one tissue property is T2.

4. The method according to claim 1, wherein determining at least one texture feature includes calculating the at least one texture feature using Gray Level Co-occurrence Matrices.

5. The method according to claim 4, wherein the at least one texture feature is one of autocorrelation, cluster prominence, cluster shade, contrast, correlation, difference entropy, difference variance, dissimilarity, energy, entropy, homogeneity, information measure of correlation 1, information measure of correlation 2, inverse difference, maximum probability, sum average, sum entropy, sum of squares: variance, and sum variance.

6. The method according to claim 1, wherein determining at least one texture feature includes calculating the at least one texture feature using Gray Level Run Length Matrices.

7. The method according to claim 6, wherein the at least one texture features is one of short run emphasis, long run emphasis, gray level non-uniformity, run percentage, run length non-uniformity, low gray level run emphasis, and high gray level run emphasis.

8. The method according to claim 1, wherein the characterization identifies the presence of a cancerous tissue in the region of interest.

9. The method according to claim 8, wherein the characterization identifies a grade of the cancerous tissue in the region of interest.

10. The method according to claim 1, wherein the tissue is prostate tissue.

11. The method according to claim 1, wherein characterizing the tissue in the at least one region of interest based on the at least one texture feature includes performing Student's t-tests on the at least one texture feature.

12. A magnetic resonance fingerprinting (MRF) system comprising:
a magnet system configured to generate a polarizing magnetic field about at least a portion of a subject;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array; and
a computer system programmed to:
acquire MRF data from a tissue in a subject;
compare the MRF data to a MRF dictionary to identify quantitative values of at least one tissue property for the MRF data;
generate a quantitative map based on the quantitative values of the at least one tissue property;
identify at least one region of interest on the quantitative map;
determine at least one texture feature of the at least one region of interest of the quantitative map;
characterize the tissue in the at least one region of interest based on the at least one texture feature; and
generate a report indicating the characterization of the tissue based in the at least one texture feature.

13. The system according to claim 12, wherein the at least one tissue property is T1.

14. The system according to claim 12, wherein the at least one tissue property is T2.

15. The system according to claim 12, wherein determining at least one texture feature includes calculating the at least one texture feature using Gray Level Co-occurrence Matrices.

16. The system according to claim 12, wherein determining at least one texture feature includes calculating the at least one texture feature using Gray Level Run Length Matrices.

17. The system according to claim 12, wherein the characterization identifies the presence of a cancerous tissue in the region of interest.

18. The system according to claim 17, wherein the characterization identifies a grade of the cancerous tissue in the region of interest.

19. The system according to claim 12, wherein the tissue is prostate tissue.

20. The method according to claim 12, wherein characterizing the tissue in the at least one region of interest based on the at least one texture feature includes performing Student's t-tests on the at least one texture feature.

* * * * *

UNITED STATES PATENT AND TRADEMARK OFFICE
CERTIFICATE OF CORRECTION

PATENT NO. : 10,908,247 B2
APPLICATION NO. : 16/418909
DATED : February 2, 2021
INVENTOR(S) : Debra McGivney et al.

Page 1 of 1

It is certified that error appears in the above-identified patent and that said Letters Patent is hereby corrected as shown below:

In the Specification

Column 1, Line 34, "(MM)" should be --("MRI")--.

Column 1, Line 57, "MM" should be --MRI--.

Column 2, Line 6, "(MM)" should be --(MRI)--.

Column 2, Line 19, "MM" should be --MRI--.

Column 3, Line 17, "MM" should be --MRI--.

Column 5, Line 55, "MM" should be --MRI--.

Column 6, Line 15, "MM" should be --MRI--.

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*